United States Patent [19]
Bolinger et al.

[11] Patent Number: 5,892,663
[45] Date of Patent: Apr. 6, 1999

[54] FLEXIBLE INSULATOR FOR TELECOMMUNICATIONS NETWORK PRINTED

[75] Inventors: Nancy J. Bolinger, Chapel Hill; Andre Byungyup Minn; Challis Llewellyn Purrington, Sr., both of Raleigh; Franklin Gerald Darroch, Durham, all of N.C.

[73] Assignee: International Business Machines Corporation, Armonk, N.Y.

[21] Appl. No.: 868,222

[22] Filed: Jun. 3, 1997

[51] Int. Cl.⁶ ...................................................... H05K 5/03
[52] U.S. Cl. .......................... 361/799; 361/750; 361/752; 361/753; 361/736; 439/68; 439/77; 439/108; 439/607; 174/35 R; 174/35 GC; 174/17 R; 174/17 CT; 174/256; 174/258
[58] Field of Search ..................................... 361/799, 752, 361/753, 757, 796, 800, 816, 818, 750, 736; 439/108, 109, 607, 609, 85, 68, 76.1, 77; 174/35 R, 35 GC, 17 R, 17 CT, 255, 256, 258

[56] References Cited

U.S. PATENT DOCUMENTS

| | | | |
|---|---|---|---|
| 4,226,491 | 10/1980 | Kazama et al. | 439/76.1 |
| 4,394,707 | 7/1983 | Consoli | 361/750 |
| 4,894,663 | 1/1990 | Urbish et al. | 343/702 |
| 5,208,734 | 5/1993 | Someno | 361/706 |
| 5,242,310 | 9/1993 | Leung | 439/76.1 |
| 5,330,360 | 7/1994 | Marsh et al. | 439/76.1 |
| 5,563,769 | 10/1996 | MacGregor | 361/737 |
| 5,568,364 | 10/1996 | Madden | 361/752 |

*Primary Examiner*—Leo P. Picard
*Assistant Examiner*—David Foster
*Attorney, Agent, or Firm*—Joscelyn G. Cockburn

[57] ABSTRACT

A device for protecting against electrical shock or other hazards from electrical components on a card includes a thin relatively flat one piece member cut and scored to form folding lines, integral latching tabs and natural hinges therein. When placed on the card and folded along the scored lines and natural hinges a protective cover for at least the pin sides and circuit sides of electrical components (modules) is provided. The device is ideally suited to protect electrical components, in situ, on a circuit card.

14 Claims, 5 Drawing Sheets

FLEXIBLE INSULATOR FOR TELECOMMUNICATIONS NETWORK PRINTED

FIELD OF THE INVENTION

The present invention relates to electrical circuit packages in general and, in particular, to protective gears used in such packages.

PRIOR ART

The proliferation of electrical machines has created several associations which promulgate standards governing the design, manufacture and/or use, of such machines. The International Electromechanical Commission (IEC) and Underwriters Laboratories (UL) are two of the organizations promulgating safety standards for electrical machines. The IEC and UL promulgate international safety standards.

In particular, IEC Standard 950 requires printed circuit boards directly connected to telecommunications networks to be provided with adequate protective systems to prevent electrical injuries such as electrical shock or the like to anyone coming in contact with the board. UL dictates similar protection for such machines.

In addition, the protective system should provide electrical strength of 1000 Vac for machines shipped to other countries and 1500 Vac for machines shipped to Australia. Moreover, Australia requires that the material forming the protective system withstand an impulse test of 1500 Volts.

Furthermore, the protective system must be one that requires a tool to remove, approved for the application and fabricated from UL recognized materials having a flame retardant rating of V-1 or better per IEC-950, UL-1950 and CAN/CSA-22.2 No. 950.

Finally, the protective system should not reduce the thermal performance of the circuit board. It must maintain electrical grounding between the circuit card and metal circuit card mounting bracket, and it must remain in place, enduring the same operational and environmental conditions that the circuit card itself may be subject to under normal conditions of use.

The prior art describes several card designs including structures for covering electrical components on a substrate, but none describes a system meeting the requirements set forth above.

U.S. Pat. No. 4,394,707 describes an electrical circuit packaged having a substrate folded in two sections with electrical components mounted to the substrate of a first section and the substrate of the second section covering the electrical components on the first section. Among the drawbacks of the structure is that it cannot be used to insulate electrical components on pre-existing cards.

U.S. Pat. No. 4,894,633 describes a foldable, radio housing having an integrally molded thermoplastic base, side walls and a living hinge interconnecting the base to a cover. The foldable housing does not meet the requirements set forth above and cannot be used to insulate electrical components of cards.

U.S. Pat. Nos. 5,563,769 and 5,568,364 describe electronic packaging of circuit cards with top and bottom covers. Again, these patents suffer from the same shortcomings as the above identified prior art.

SUMMARY OF THE INVENTION

It is an object of the present invention to provide a more effective insulator than was heretofore possible.

It is another object of the present invention to provide an insulator for selectively insulating portions of a circuit card without modifying the circuit card in any way.

The insulator is fabricated from a one-piece insulative material in which an opening and concatenated, natural hinges are formed. The opening and natural hinges separate the insulative material into two sections, each section adaptable to cover electrical components on opposite sides of a circuit carrying card. Sections of the insulator are selectively scored to generate a plurality of subsections which form peripheral walls when folded along respective score lines. A latching mechanism comprising slot and engagement tabs are formed on adjacent ones of the peripheral walls.

In another feature of the invention, holes are provided on the other section of the insulator. Fasteners are passed through the holes to electrically couple the insulator to the electrical ground of the card. The fasteners, also, attach the insulator to the card. Thus, making it impossible to disconnect the insulator from the card without using a tool.

In another feature of the invention, holes may optionally be provided in at least one section of the insulator. The holes allow heat to escape from the circuit board.

In yet another feature of the invention, double-faced foam adhesive strips of tape may be attached to the insulator. The tape coacts with the circuit card to further secure the insulator to the card.

The foregoing and other features and advantages of the invention will be more fully described in the accompanying drawings.

DETAILED DESCRIPTION OF THE PREFERRED EMBODIMENT

Figure 3:
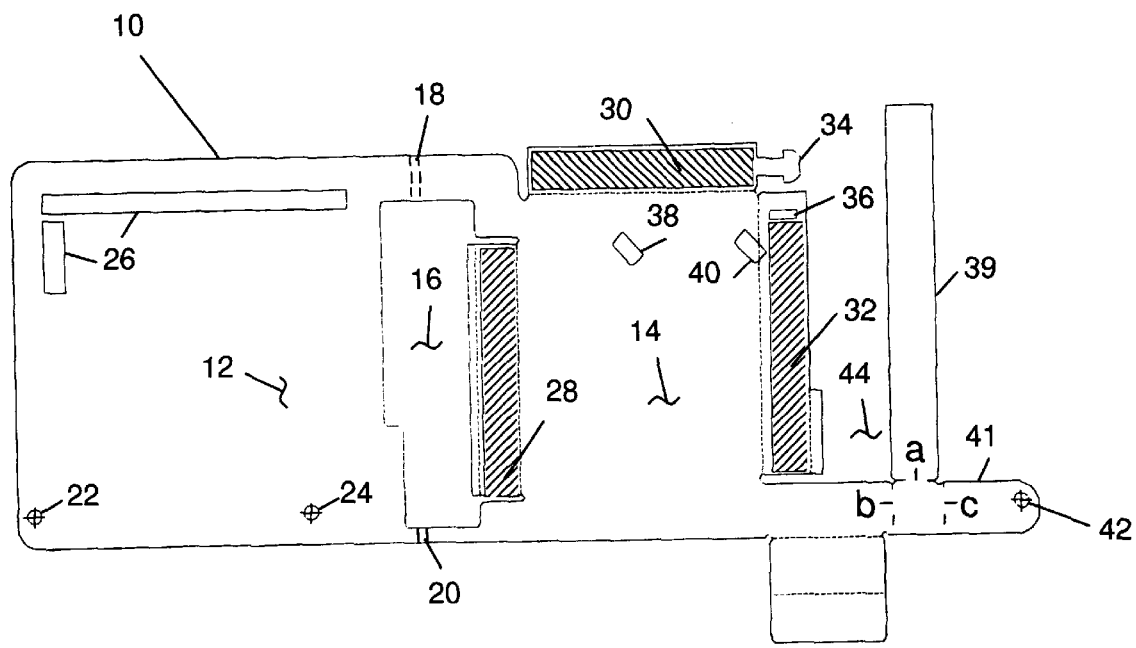
FIG. 3 shows a plan view of the insulator according to the teachings of the present invention.

FIG. 3 shows a plan view of the insulator according to the teachings of the present invention. The insulator is formed from a one-piece material 10, cut and scored to provide foldable pieces which insulate (i.e., cover) selected components and portions of a circuit card (described hereinafter). The one-piece material 10, includes solid sections 12 and 14 interconnected by opening 16 and natural hinges 18 and 20, respectively. As will be described subsequently, the width of the natural hinges are scored to be approximately the same size as the thickness of the card. The opening 16 allows the insulator to be folded at the natural hinges 18 and 20, respectively. When folded along the natural hinges 18 and 20, solid section 12 of the insulator covers one side of the card and section 14 covers the opposite side of the card. Openings 22 and 24 are fabricated in section 12 of the insulator. The openings accept screws (to be described below) which mate with flat, circular washers and nuts mounted within the mounting bracket to attach the insulator to the card. As will be discussed subsequently, the same screw attaches the mounting bracket (to be described subsequently) to the card and electrically grounds the insulator to the ground plane of the card. As an additional means of securing the insulator to the card, an adhesive strip 26 is attached to section 12. Preferably, strip 26 includes a double-face high-bond strength vinyl foam adhesive back tape. The adhesive strip 26 is preferably a double-sided sticking tape with one side attaching the strip to surface 12 and the other side coacting with the card to which the insulator is to be mounted. It should be noted that other types of attachment assemblies can be used to attach and electrically ground the insulator to the circuit card.

Still referring to FIG. 3, section 14 protects components on the side of the circuit card opposite to the side covered by section 12. Section 14 includes a plurality of rectangular strips or elongated side members identified by numerals 28, 30 and 32. The shading on these strips indicate that when folded along their respective scored lines shown by broken lines in the figure, they represent different surfaces, albeit on the same side of the card which is being insulated. The elongated side member 30 is fabricated with latching finger 34. When attached to a card, the latching finger 34 coacts with slot 36 in elongated side member 32 to hold the insulator firmly. A pair of optional breathing holes identified by numerals 38 and 40 may be fabricated in section 14. The optional breathing holes allow cooling of the components covered by section 14 of the insulator. A "T" shaped extended portion of surface 14 is scored along lines a, b and c, respectively. When attached to a card, the rectangular section 39 (FIGS. 3 and 2A) is folded along score line a and extends along a first surface (preferably covering one surface of connectors mounted on the card) of the card. Similarly, section 41 is folded along score line b to cover components on the opposite side of the card (see FIG. 2B). A hole 42 is fabricated in section 41. As will be described subsequently, the hole 42 aligned with holes 22 and 24 and screws 60 and 62 are used for attaching the insulator to the card (see FIG. 2B). The opening 44 between section 39 and section 32 of the insulator is used for aligning the insulator relative to connectors and the attachment bracket mounted on the card.

Figure 2A:
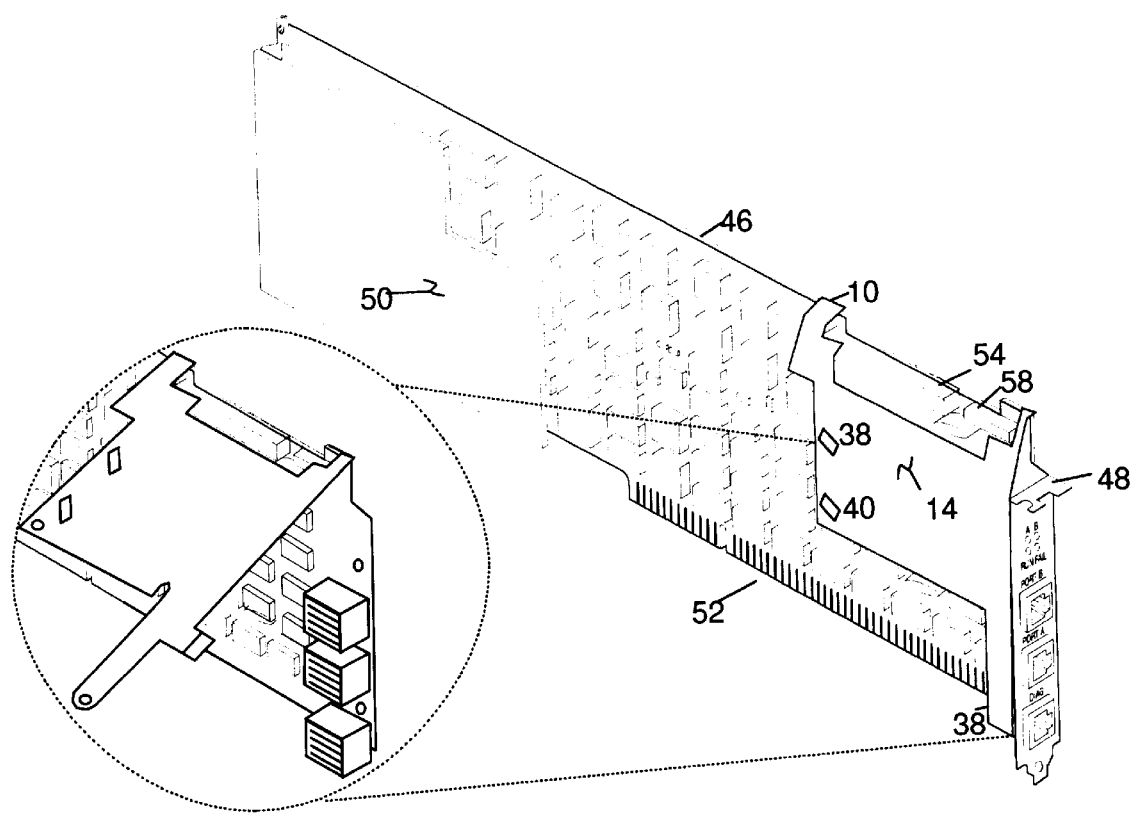
FIGS. 2A and 2B show an insulated circuit card for mounting in the machine of FIG. 1.
Figure 2B:
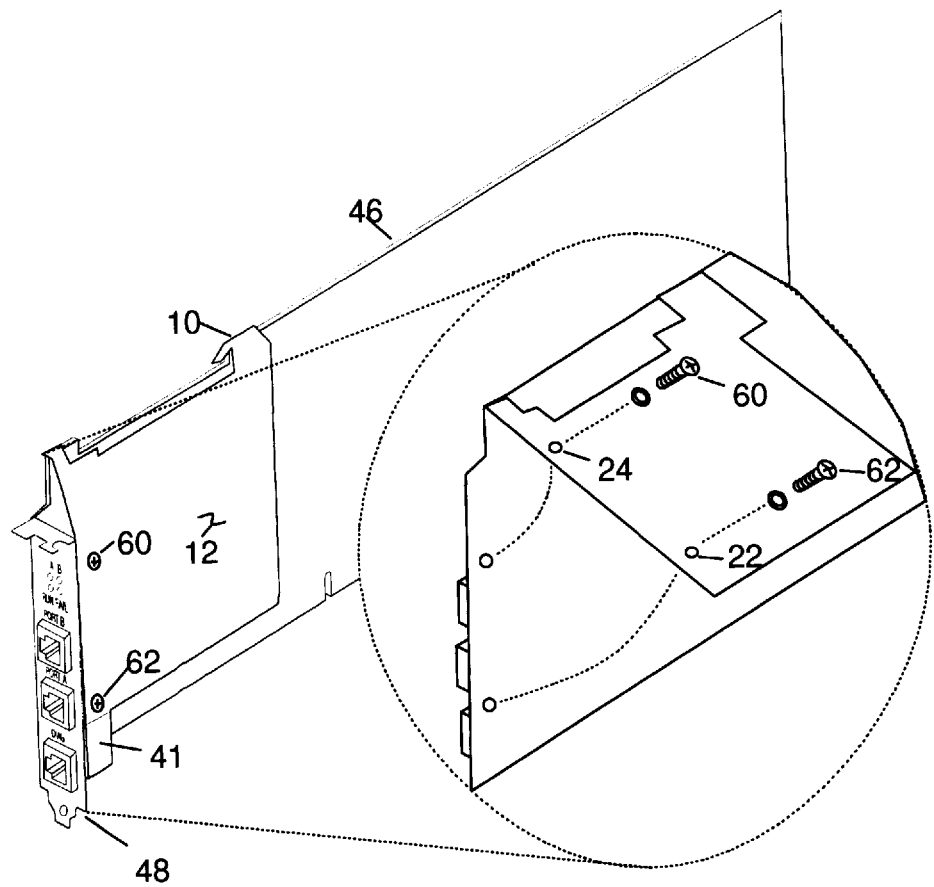
Figure 4:
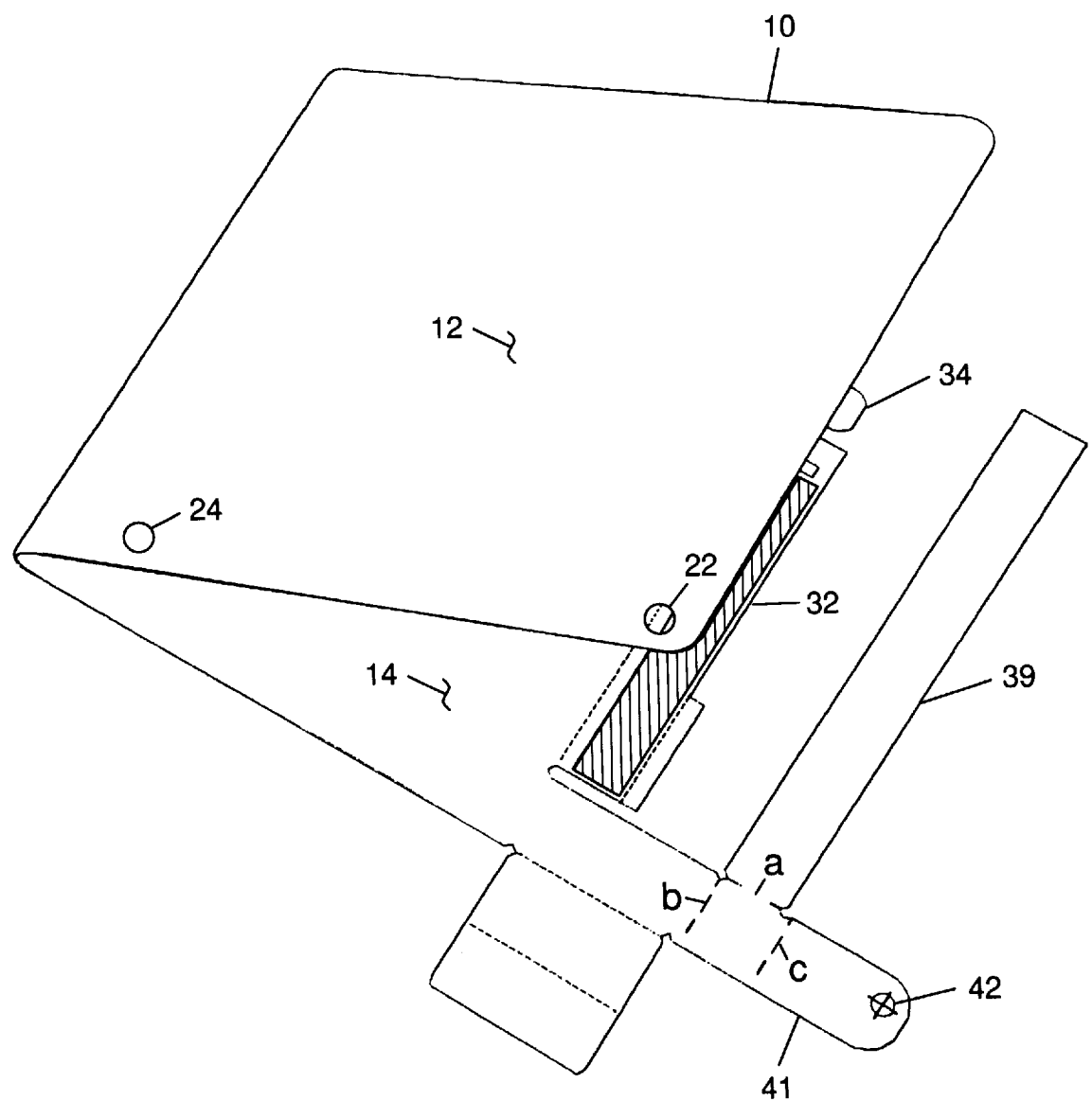
FIG. 4 shows a view of a partially folded insulator.

Turning to FIG. 4 for the moment, a partially folded view of insulator 10 is shown. For consistency, common numerals are used to identified like elements of the insulator in FIG. 3 and FIG. 4. In FIG. 4, the insulator is folded along the natural hinges 18 and 20 (FIG. 3), respectively. When the insulator is attached to a card, as shown in FIGS. 2A and 2B, section 12 of the insulator covers components and/or the pin side of components on one side of the card and section 14 covers the opposite side of the card. The elongated side member 32 is folded along the broken line and forms a side wall for insulating the electrical components it encases. In addition, hole 42 matches or overlays hole 24. Consequently, only a single fastening device is required to assist in fastening the insulator to the card. Referring again to FIG. 3 for the moment, the other elongated side members 28 and 30, when folded along their respective scored lines form sidewalls for insulating electrical components they encase. Thus, it can be seen from FIG. 3 that the elongated side members 28, 30 and 32, when folded form sidewalls, insulating components, along three sides of the card.

A general guide for selecting an appropriate material from which the insulator is fabricated is that the material should be flame retardant, meeting UL-1950, CSA 950 and IEC 950 requirements. In the preferred embodiment of the invention, the insulator was manufactured from flame-retardant polypropylene. The material has the following characteristics:

Thickness: Approximately 0.43 mm +0.08/−0.03
Dilectric Strength: 1460 Volts/Mil

UL recognized and CSA approved materials
UL 94 Volts—0 Flame class rating
Non-hygroscopic (moisture absorption less than 0.1%)

Of course, it is within the skill of the art to select material having other characteristics without deviating from the spirit and teachings of the present invention.

FIGS. 2A and 2B show an insulated card assembly including circuit card 46, mounting bracket 48 and insulator 10. Preferably, circuit card 46 is a Wide Area Network (WAN) card. For consistency, the same numerals are used to identify common elements. The mounting bracket 48 is used to mount the card in a housing (to be described hereinafter). The insulator 10 is tightly connected to the card to cover selected components on the card while at the same time leaving necessary connectors and switches accessible. By covering components and pins which may carry hazardous voltage, the likelihood of personnel being injured by such voltage is eliminated. Even though the insulator 10 can be used to insulate components on various types of circuit cards, sound cards, modem cards, LAN cards and other devices directly connecting to telecommunications network, the insulator works well with a wide area network (WAN) card and as such will be described in that environment. However, this should not be construed as a limitation on the scope of the present invention since it is well within the skill of one skilled in the art to make minor adjustments in cutting and scoring the insulator cards without deviating from the spirit and scope of the present invention.

Still referring FIG. 2A, the WAN card 46 includes a non-conductive substrate on which a plurality of electrical modules, interconnecting conductors and other electrical components are mounted. A daughter card 50 is mounted onto the main or mother card and a second mother card (not shown) is covered by section 14 of insulator 10. The mother card covered by insulator 10 carries the components which contain relatively unsafe levels of electrical charges which is to be protected. The mother card covered by insulator 10 connects to the telecommunications network (not shown). Port B and Port A are connectors which are connected to the card and are accessible through mounting bracket 48. A third port labeled DIAG carries a connector which provides access for diagnostic purposes on the card. Indicators labeled RUN and FAIL indicates the status of the card when it is running in a machine (see FIG. 1). A first printed circuit connector labeled 52 connects the card to the machine bus (Industry Standard Architecture or other bus). Connector 54 provides connection to Multi-Vendor Interface Protocol (MVIP) bus machine. A switching module 58 contains a plurality of conventional card switches to be used to set various parameters of the card. FIG. 2A primarily shows the component side of the card with section 14 of the insulator 10 covering the DSU/CSU (Data Service Unit/Channel Service Unit) modules.

Turning to FIG. 2B, the pin side of the card is shown with section 12 covering the pin side of the DSU/CSU modules. It should be noted that screws 60 and 62 are inserted through the openings in the insulator to attach the bracket 48 and the insulator to the card. As stated previously, washers are on the opposite side of the card and electrically ground the mounting bracket 48 to the ground plane of the card.

In accordance with the invention, the blank insulator is cut and scored according to the teachings set forth above. The insulator can be readily formed by laser cutting, die cutting and scoring to form the desired shapes and bends consistent with the components to be covered on the card. The formed insulator is folded over the card and latched to a location on the opposite side of the card, leaving necessary connectors, such as 54, and switches, such as 58, accessible for use while shielding personnel and the equipment users from contacts with Telephone Network Voltage (TNV) circuits and pins that may carry potential hazardous ring voltages. The latching mechanism (such as catch 34 opening 36, FIG. 3) is simple and easy to use. It provides positive and secure engagement so that it does not come loose in normal conditions of operation and use of the card. After folding, the elongated side members 28, 30 and 32 (FIG. 3) form a box around the DSU/CSU modules. The holes in the insulator provide a means of secure attachment on the existing card mounting bracket screws while allowing the bracket to maintain electrical ground to the card. The device can be attached and removed without altering the printed circuit card.

Figure 1:
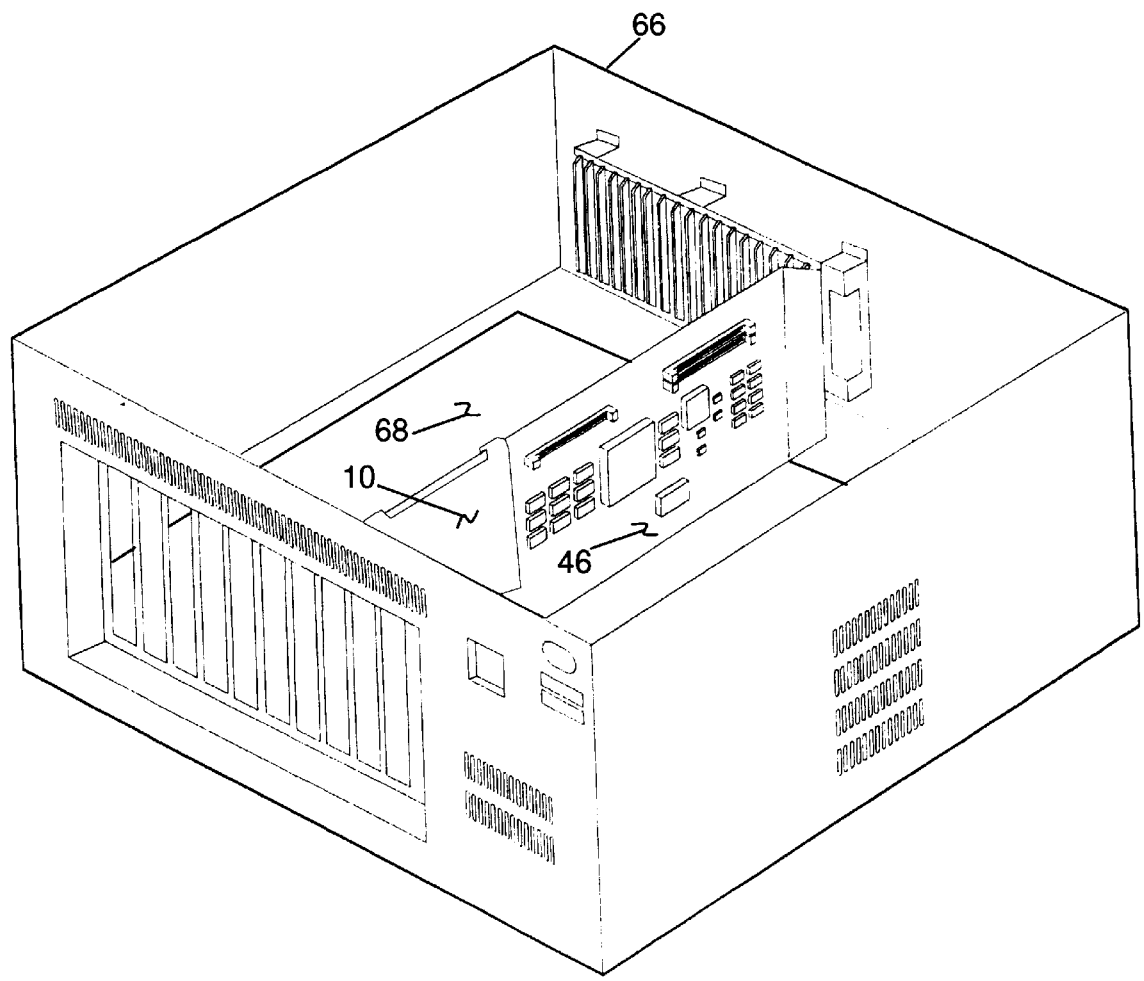
FIG. 1 shows a perspective view of a machine such as the IBM® 8235 DIAL-IN Access to LANs (DIALs) Switch, in which the present invention is used.

FIG. 1 shows a machine in which the circuit card 46 and insulator 10 can be used. The machine includes a housing 66 in which a mother board 68 is mounted. The housing includes a plurality of slots in which a plurality of circuit cards, one in each slot, can be inserted. Each card is connected to the motherboard via one or more connectors. The circuit card 46 has its high voltage section covered by the insulator of the present invention and is connected by a connector to the motherboard.

Even though a preferred embodiment of the insulator has been described, it will be evident to those skilled in the art to make many alterations, modifications and changes which would fall within the scope of applicant's invention. Any such changes and/or modifications are deemed to enure to the benefit of the inventors.

We claim:

1. A device for in situ covering of components on a card including:
    a one-piece insulator having at least one natural hinge concatenated to an opening, said at least one natural hinge and opening separating said one-piece insulator into a first section and a second section with each section having selected dimensions for covering a desired surface area;
    an integral latching mechanism fabricated on said one piece insulator; and
    openings for fastening said one piece insulator.

2. The device set forth in claim 1 further including a plurality of peripheral side members form in at least one of the first section or the second section.

3. The device of claim 2 wherein the peripheral side members are formed by selectively scoring relative to selected sides of the at least one of the first section or the second section.

4. The device of claim 3 further including an unscored side of said at least one of the first section or the second section being extended into a T-shaped structure.

5. The device of claim 1 wherein the material used to fabricate the one-piece insulator includes a polypropylene sheet.

6. The device of claim 5 wherein the polypropylene sheet is flame retardant.

7. The device of claim 2 wherein the integral latching mechanism further includes latching tabs fabricated on one of the peripheral side members and a slot for receiving the latching tabs fabricated on another one of the side members.

8. A sub-assembly for use in an electrical machine comprising:
    a circuit card including a substrate, a plurality of electrical components mounted on the substrate and connectors for transmitting electrical signals onto the card and from the card mounted on said substrate;
    an insulator sheet having a first section covering selected electrical components on a first, components side of the card and a second section covering a selected area on a second, pin side of the card; and fasteners for connecting the insulator sheet to the card.

9. A sub-assembly for use in an electrical machine comprising:
    a circuit card including a substrate, a plurality of electrical components mounted on the substrate and connectors for transmitting electrical signals onto the card and from the card mounted on said substrate;
    an insulator sheet having a first section covering selected electrical components on a first side of the card and a second section covering a selected area on a second side of the card; fasteners for connecting the insulator sheet to the card; and a structure for electrically grounding the insulator sheet to the electrical ground of the card.

10. The sub-assembly of claim 9 wherein the insulator sheet further includes an integral latching mechanism.

11. The sub-assembly of claim 9 further including a pair of adhesive tape members one of each mounted in spaced alignment on the card and insulator sheet, respectively and when placed into contact bond said insulator sheet to said card.

12. The sub-assembly of claim 9 wherein the fasteners include screws.

13. The sub-assembly of claim 12 wherein the structure for electrically grounding the insulator sheet includes at least one washer.

14. An electrical machine including:
    a frame; and
    at least one electrical, sub-assembly operatively mounted in said frame, wherein said at least one electrical sub-assembly including
    a circuit card including a substrate, a plurality of electrical components mounted on the substrate and connectors for transmitting electrical signals onto the card and from the card mounted on said substrate,
    an insulator sheet having a first section covering selected electrical components on a first, component, side of the card and a second section covering a selected area on a second pin, side of the card, and fasteners for connecting the insulator sheet to the card.

* * * * *